United States Patent [19]

Frank et al.

[11] Patent Number: 5,019,893
[45] Date of Patent: May 28, 1991

[54] SINGLE PACKAGE, MULTIPLE, ELECTRICALLY ISOLATED POWER SEMICONDUCTOR DEVICES

[75] Inventors: Randall K. Frank, Scottsdale; Jerry M. DuBois, Mesa, both of Ariz.

[73] Assignee: Motorola, Inc., Schaumburg, Ill.

[21] Appl. No.: 486,661

[22] Filed: Mar. 1, 1990

[51] Int. Cl.$^5$ ............................................. H01L 23/02
[52] U.S. Cl. ........................................ 357/81; 357/70; 357/72; 357/69
[58] Field of Search ................ 357/70, 72, 81, 69

[56] References Cited

U.S. PATENT DOCUMENTS 4,589,010  5/1986  Tateno et al. .................... 357/72

FOREIGN PATENT DOCUMENTS

| 58-222554 | 12/1983 | Japan | 357/70 |
| 59-027559 | 2/1984 | Japan | 357/72 |
| 59-149042 | 8/1984 | Japan | 357/70 |
| 61-150355 | 7/1986 | Japan | 357/69 |
| 62-115854 | 5/1987 | Japan | 357/81 |

Primary Examiner—Jerome Jackson, Jr.
Assistant Examiner—Dang Xuan Hung
Attorney, Agent, or Firm—Joe E. Barbee; Robert M. Handy

[57] ABSTRACT

Single package, electrically isolated dual, triple, quad, etc., power semiconductor devices are provided without use of ceramic or other isolators between the semiconductor die and the die support. For example, isolated dual power transistors, each having three leads, are encapsulated within the same package outline and lead footprint as a seven lead TO-218 or TO-220 by dividing the die flag into two spaced-apart portions, one for each die, connecting the first three leads to the first transistor and die flag, connecting the last three leads to the second transistor and die flag, and omitting the centrally located fourth lead. The spaced-apart die flags and leads are supported by a molded encapsulation.

3 Claims, 1 Drawing Sheet

SINGLE PACKAGE, MULTIPLE, ELECTRICALLY ISOLATED POWER SEMICONDUCTOR DEVICES

FIELD OF THE INVENTION

This invention concerns means and methods for encapsulating electronic devices and, more particularly, power semiconductor devices.

BACKGROUND OF THE INVENTION

As used herein the words "power devices" or "power semiconductor devices are intended to refer to devices carrying currents of about 1 amps or more, and blocking voltages of about 40 volts or more, and the words "chip" or "die" are used interchangeably to describe portions of semiconductor or other electronic wafers or substrates containing one or more electronic elements, as for example but not limited to, transistors, thyristors, diodes, capacitors, resistors, and so forth.

Power devices, especially power semiconductor devices, are widely used in the electronic arts. Such devices are typically enclosed in single device packages, that is, one Power device per package. This is because most power device chips are comParatively large and because there is a great Premium on heat removal from the chip during operation. In order to have efficient heat removal it is generally necessary to have large die flags or heat spreaders.

A great many different arrangements well known in the art are used for packaging individual power devices to suit particular circumstances. For example, the designations TO-3, TO-218, TO-220 are familiar to most electronic designers as representing standardized power device package configurations. Many other standardized package configurations are well known in the art. The dimensions, lead spacings and shape of a particular device package configuration is referred to in the art as the device "footprint" and is used in laying out the lead attachment points and the clearance space on the PC board that will be occupied by the device.

Some of these standardized package configurations are registered with the Joint Electron Device Engineering Council (JEDEC) which maintains a file of agreed body and lead dimensions, arrangements and spacing for the registered package designs. Many different manufacturers offer a wide variety of power devices having different electrical functions and characteristics in these standardized package designs. This simplifies design of the printed circuit (PC) boards to which the devices are intended to attach.

While it has been the habit for many years to package power devices individually, i.e., one power device chip or die per package, there is an increasing need for multi-device packages, that is, unitary assemblies or combinations of several power device chips or combinations of power device chips and integrated circuit (IC) in a single housing or package. This need is especially acute in the automotive and appliance electronics field where driver and/or control circuits frequently require from two to eight or more power devices to run a variable speed motor or drive fuel injectors or ignition systems or anti-skid brake actuators or control some other high current load.

A feature of these circuits is that the multiple power devices must be electrically isolated, that is, not have a common electrical reference connection. This is difficult to accomplish with power devices which dissipate large amounts of heat and where the back side of the semiconductor chip, which is the face through which heat is normally extracted, forms one of the electrical terminals.

Much effort has gone into developing electrically isolated multi-chip packages or assemblies. One approach is to provide a thermally conductive but electrically insulating material (i.e., an isolator) between the power device and the heat sink. Alumina, beryllia and mica are well known isolators. The isolator may be between the semiconductor die and the die flag (i.e., internal to the package), or between the package base and the external heat sink or radiator (i.e., external to the package). The former method adds substantially to the cost of constructing the packaged power device and the latter adds substantially to the cost of assembling the packaged device on the circuit board.

Another approach is to mount multiple devices on a metallized plastic or ceramic insulating substrate. For example, semiconductor die are mounted directly on metallized areas of a miniature PC board with interconnecting wiring thereon to connect the die to external leads. The assembly is then enclosed in some type of encapsulation. This type of construction is comparatively expensive and efficient heat removal is difficult or impossible.

Another approach has been to build several power devices on a single semiconductor die. However, such die become very large, manufacturing yield is low, and this approach is prohibitively expensive for many applications. Accordingly, there continues to be a need for low cost package designs and methods which provide multiple, electrically isolated power devices within a single enclosure.

SUMMARY OF THE INVENTION

It is an object of the present invention to provide an improved means and method for single package, multiple die, electrically isolated power devices, especially power semiconductor devices. It is a further objective to do so using mature technology which is especially low in cost and high in reliability. It is a still further objective to, in so far as possible, provide single package, multiple die, electrically isolated power devices which are compatible with existing standard package configurations, for example, which have the same lead spacing and fit into the same PC board footprint as existing standard packages.

The foregoing and other objects and advantages are provided by an improved power device structure comprising, multiple external leads protruding from a first edge of the device and having a first predetermined center-to-center spacing within first and second groups of the external leads adjacent, respectively, first and second ends of the device and having a second predetermined center-to-center spacing equal to an integral multiple of the first center-to-center spacing between the first and second groups of the external leads, at least first and second spaced-apart die flags wherein the first die flag is electrically coupled to an external lead of the first group and the second die flag is electrically coupled to an external lead of the second group, and where the die flags are adapted to receive at least first and second electronic elements electrically coupled, respectively, to the first and second die flags.

The spaced-apart die flags and the leads are held together by a surrounding encapsulation, preferably molded plastic. The spaced-apart die flags may have their lower faces opposite the die bonding areas exposed on one face of the molded encapsulation to facilitate maximum heat transfer, or the plastic encapsulation may be over-molded to completely enclose the die flags and provide built-in electrical isolation from an external heat sink or radiator.

It is desirable that the first and second die flags have facing edges with facing notches therein creating a space therebetween, and that a mounting hole extend through the encapsulation means in this space without touching the die flags. The device is conveniently formed using a one piece leadframe. It is further desirable that the die flags be coplanar and that the leads be coplanar. Any number of isolated power die can be accommodated by providing separate die flags and associated groups of leads.

The above described arrangement conveniently uses standard lead spacings, as for example corresponding to the lead spacing (and lead size) of the TO-218 or TO-220. A preferred embodiment of a dual isolated power die package provides a single package, dual three lead transistor device (i.e., six leads total) that fits in the same PC board footprint as a seven lead TO-218, but with the central lead missing. This arrangement substantially reduces the occupied PC board area as compared to having two individually packaged power transistor devices.

The above described devices is formed in a preferred embodiment by a method comprising, providing a leadframe having at .east first and second spaced-apart electrically isolated die flags for receiving, respectively, providing at least first and second electronic elements and at least first and second external leads connected, respectively, to the first and second die flags, providing at least a third external lead extending toward but not touching the first die flag and at least a fourth external lead extending toward but not touching the second die flag, wherein the leads are separated by integral multiples of a predetermined center-to-center spacing, wherein the at least first and third leads and the at least second and fourth leads are separated by the predetermined center-to-center spacing and the at least second and third or the at least first and fourth leads are separated by at least twice the predetermined center-to-center spacing.

The first and second electronic elements are mounted, respectively, on the first and second die flags and the at least third and fourth leads are connected, respectively, to the first and second electronic elements. An encapsulation separating the die flags, electronic elements and the leads is then formed around these elements so that portions of the leads protrude. Rear faces of the die flags may also remain exposed if desired. After encapsulation, other portions of the leadframe extending beyond the encapsulation and the external leads are removed.

It is desirable that the steps of providing the leadframe and forming the encapsulation comprise, providing a leadframe wherein the die flags include facing notches for providing a larger space therebetween and forming the encapsulation around the die flags while leaving an opening extending through the encapsulation between the notches for receiving a mounting means which is prevented from touching the die flags by a portion of the encapsulation. It is preferred that a one-piece leadframe be provided, wherein the die flags are coplanar and the leads are coplanar. The leads need not be coplanar with the die flag.

The present invention will be more fully understood by considering the accompanying drawings and explanation thereof that follows.

DETAILED DESCRIPTION OF THE DRAWINGS

Figure 1:
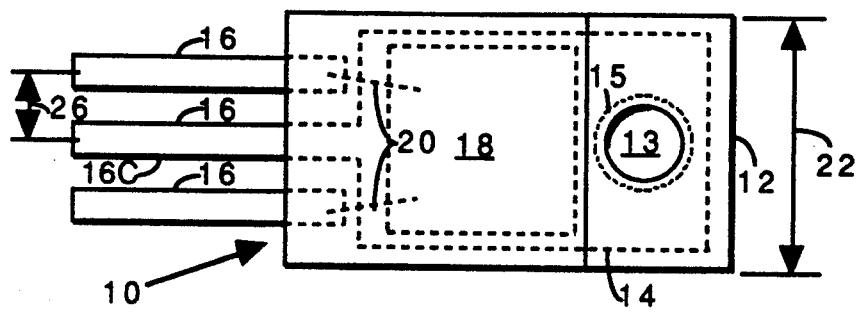
FIG. 1 is a simplified top view and FIG. 2 is a simplified side view of a typical single die, three lead, power device of the prior art.
Figure 2:
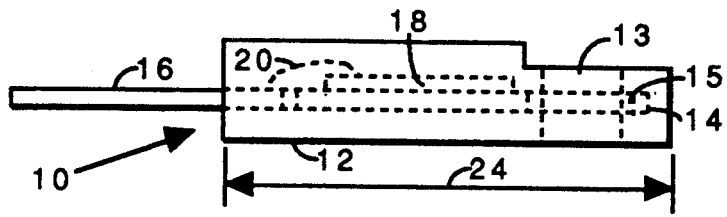

FIG. 1 is a simplified top view and FIG. 2 is a simplified side view of single die, three lead power device 10 of the prior art. Device 10 has molded plastic body 12 with mounting hole 13. Mounted within body 12 is die flag 14 having hole 15 therein. Leads 16 connect to die flag 14 and electronic die, e.g., transistor, 18 by wire bods 20. Transistor 20 is mounted directly on die flag 14. Body 12 has width 22 and length 24, and leads 16 have center-to-center spacing 26. Means and methods for constructing such devices are well known in the art.

FIGS. 1-2 illustrate an over-molded device package, i.e., a package in which plastic has been molded all around die flag 14 so that it is completely enclosed, thereby providing complete electrical isolation of die flag 14, except for lead 16C connected thereto. The type TO-218 Full Pak TM is an example of such an over-molded package well known in the art. "Full Pak" is a trademark of Motorola, Inc.

Alternatively, plastic body 12 may be made smaller so that a portion of die flag 14 containing hole 15 extends beyond plastic body 12 and the rear face of die flag 14 opposite the location of die 18 may also be exposed on the lower face of body 12. Ordinary type TO-218 and TO-220 package configurations are of this type. Means and methods for constructing such devices are well known in the art.

Figure 3:
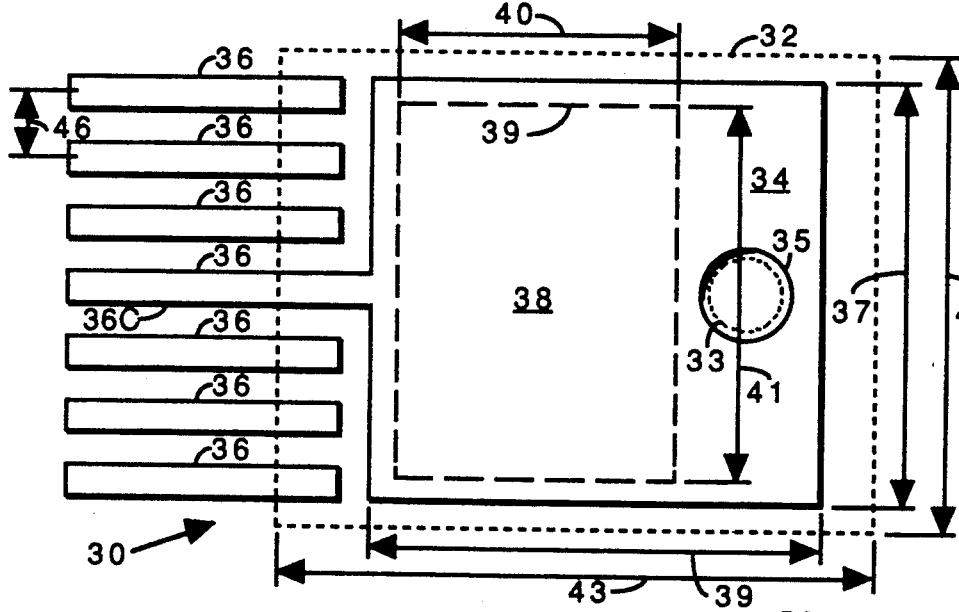
FIG. 3 is a simplified top view of a portion of a leadframe of a prior art device having seven leads.

FIG. 3 is a simplified top view of a portion of a leadframe of prior art device 30 having die flag 34 with mounting hole 35 and seven external leads (36). The dotted line in FIG. 3 shows the location of encapsulation 32 analogous to encapsulation 12 of FIGS. 1-2, with mounting hole 33 passing through die flag hole 35. Like FIGS. 1-2, FIG. 3 corresponds to an over-molded arrangement where die flag 34 is enclosed within body 32, but this is merely for convenience of explanation and is not essential.

Die flag 34 has exterior dimensions 37, 39 and die mount region 38 encompassed by dashed line 39 of maximum dimensions 40, 41. Body 32 has exterior dimensions 42, 43. Leads 16 have center-to-center 46. Central lead 36C connects to die flag 34.

Figure 4:
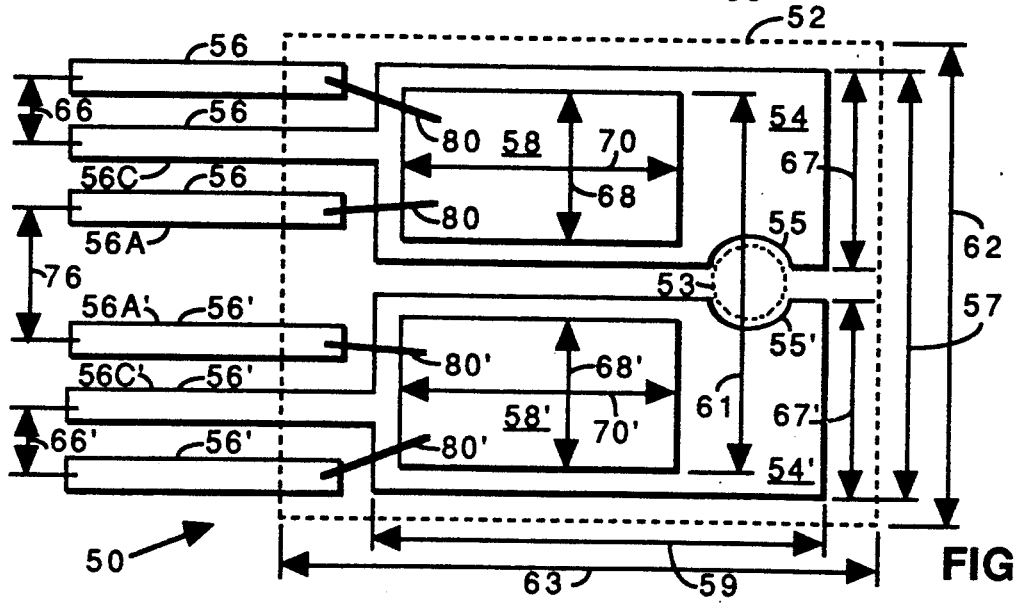
FIG. 4 is a simplified top view analogous to FIG. 3 of a portion of a leadframe according to a preferred embodiment of the present invention for a dual, isolated, power device having the same PC board footprint and lead spacing as in FIG. 3.

For a seven lead type TO-218 leadframe and overmolded device, body width 42 is nominally about 14.2 mm, body length 43 is nominally about 20.2 mm, die flag width 37 is nominally about 12.2 mm, die flag length 39 is nominally about 15 mm, die bond region 48 has width 41 nominally about 9.3 mm and length 40 nominally about 7.9 mm, and center-tocenter spacing 46 of leads 16 is nominally about 1.7 mm. Body thickness, lead thickness, lead width, mounting hole diameter, and other dimensions of the TO-218 are well known in the art. Thus, one or more semiconductor or other electronic die having dimensions up to 8.0×6.6 mm may be mounted on die flag 34. If the die are to be electrically isolated from each other and common die flag 34, then insulating separators must be provided between the die and die flag 34. This is expensive to do and increases the junction-to-case thermal impedance, FIG. 4 is a simplified top view analogous to FIG. 3 of a portion of a leadframe according to a preferred embodiment of the present invention illustrating how dual, isolated power device 50 having the same PC board footprint as device 30 in FIG. 3 is constructed. Device 50 has body 52 of width 62 and length 63, analogous to body 32 in FIG. 3 and of substantially the same dimensions, that is width 62 is substantially the same as width 42, length 63 is substantially the same as length 43 and mounting hole 53 has substantially the same size and location as mounting hole 33. Also leads 56 are the same as leads (36) and spacings 66, 66' are the same as spacing 46.

In other respects, however, device 50 is different. In particular, the die flag has been split into two spaced-apart portions 54, 54' having die mount regions 58, 58' of width 68, 68' and length 70, 70'. Spaced-apart die mount flags 54, 54' have individual widths 67, 67'. Total width 57 and and length 59 of die mount flags 54, 54' are substantially the same as dimensions 37, 39 in FIG. 3. Lengths 70, 70' of die bond regions 58, 58' are substantially the same as length 40 and total die mount width 61 is the same as width 41. Die flags 54, 54' conveniently connect to leads 56C, 56C'.

For the same overall dimensions listed in connection with device 30 of FIG. 3, die mount regions 58, 58' in FIG. 4 have widths 68, 68' nominally about 3.9 mm and lengths 70, 70' nominally about 7.9 mm. Thus, semiconductor or other electronic die of up to about 2.5×6.6 mm can be accommodated in the arrangement of FIG. 4 while still keeping the footprint of device 50 the same as that of device 30, with the exception that lead 36C in FIG. 3 is not needed in the arrangement of FIG. 4 and may be omitted, as shown. Silicon power transistor die of this size (2.5×6.6 mm) can handle up to about 40 amps, depending on the heat sinking arrangement, and also withstand substantial voltages, making the dual device of the sort illustrated in FIG. 4 very useful for many power device applications.

Even though lead 36C of FIG. 3 has been omitted in FIG. 4, the periodicity of leads 56, 56' remains the same as in FIG. 3. That is, spacings 66, 66' are the same as spacings 36, and spacing 76 between leads 56A, 56A' is an integral multiple of spacing 66, 66', in this example, twice spacing 66, 66'. This insures that device 50 fits in the same footprint as device 30.

Another feature of device 50 is the provision of notches 55, 55' in die flags 54, 54'. Notches 55, 55' create additional space between die flags 54, 54' so that opening 53 through package body 52 may pass between spaced-apart die flags 54, 54' without touching. Further, it is convenient to mold plastic between spaced-apart die flags 54, 54' and into notches 55, 55' so that there is encapsulation plastic of body 53 between hole 53 and die flags 54, 54'. This allows a metallic fastener to be used in hole 53 without fear of shorting otherwise isolated die flags 54, 54'.

Die mounted on regions 58, 58' of die flags 54, 54' are connected to leads 56, 56' by wire bonds 80, 80', but other bonding means well known in the art may also be used. When device 50 is encapsulated as an overmolded device, die flags 54, 54' are located entirely within body 52 and device 50 resembles FIG. 2 when viewed from the side. However, device 50 may also be encapsulated so that the lower surfaces of die flags 54, 54', opposite die mount regions 58, 58', are exposed on the lower surface of body 52. Because, hole 53 is plastic lined, no insulating washers or sleeves are required and it is easy to assemble device 50 to a PC board or heat sink.

As those of skill in the art will appreciate, while single hole 53 and notches 55, 55' are provided in FIG. 4 so as to have exactly the same mounting hole location as for device 30 of FIG. 3, separate insulated or non-insulated holes can be provided in die flag portions 54, 54' so that each die flag portion could attach separately to its own separate heat sink or other thermal radiator.

Die flags 34, 54, 54' and leads 36, 56, 56' are shown in FIGS. 3-4 in the form in which they appear in the finished device, that is, after the usual side rails, mold dam bars and supports have been trimmed away. However, those of skill in the art will understand that side rails, dam bars and supports (not shown) are customarily used to support the leads and die flags during assembly so that many devices can be handled simultaneously. Such arrangements are well known in the art and are described for example in U.S. Pat. 3413713, 3611061, 4283838, 4012765, and 4003544, which are incorporated herein by reference. Copper, copper alloys, aluminum, and nickel-iron alloys (e.g., Alloy 42, Kovar, etc.) are commonly used leadframe materials which are suitable for use in the present invention. They may be plated or plain. Copper or copper alloy leadframes are preferred. It is also preferred that the leadframe of the present invention and the encapsulation provide a finished device footprint corresponding to an already established multi-lead device footprint, but this is not essential.

The above-described device is formed by the steps of providing a leadframe having a multiplicity of multi-die units having the above-described features and intended to be contained within a single package and supported, for example by side rails, bonding electronic die to the die flags, bonding connecting wires or equivalent between the leads which are not attached to the die flags to the corresponding bonding locations on the electronic die, placing the assembled leadframe in a mold and covering the multiple die flags, multiple die and bonding wires of each multi-die unit in a single plastic body which fills in the spaces separating the multiple die flags, and then trimming away any side rails, dam bars and other supports of the original leadframe so as to obtain for each multi-die unit, the desired single package, isolated multi-die, device.

It is important that the encapsulation used to cover the die, die flag and wire bonds, and fill in the space between the die flags, be mechanically strong since it holds the multi-die flag, single package device together. Epoxies and filled epoxies are preferred, but other encapsulants can be used provided that the have the needed mechanical strength. Ceramic and glass materials are less desirable because of their higher cost and the much higher temperatures that are required for their use. In general, low cost metal leadframes of the sort preferred for the present invention are not used with glass and ceramic encapsulation materials although that is not precluded.

One of the great advantages of the present invention is that the leadframe used to form the devices may be a single piece metal leadframe, although a multi-piece leadframe is not precluded. Single piece metal leadframes are much less expensive and much easier to fabricate and handle as compared to multi-piece leadframes. Further, single piece metal leadframes are much less expensive and much more thermally conductive than metallized ceramic or plastic substrates used in the prior art to form multi-die modules.

A further advantage of the present invention is that die flags 54, 54' are coplanar. This is preferred but not essential. Having coplanar die flags greatly facilitates manufacturing and use since die bonding is made easier and attachment to an external heatsink or heatsinks is much simplified. A further advantage is that leads 56, 56' are also coplanar. This is preferred but not essential. Having coplanar leads greatly facilitates assembly and encapsulation. After encapsulation and trimming, the leads may be formed to have a variety of alignments, for example, so as to form several parallel coplanar rows rather than a single coplanar row, or to be in a polygonal or circular arrangement when viewed end-on.

It is not essential that the die flags be coplanar with the leads. For example, the die flags may be down-set with respect to the leads so that the top surfaces of the die are approximately coplanar with the top surfaces of the leads to facilitate wire bonding therebetween.

A further advantage of the present invention is that the single package, multiple die, electrically isolated power devices are obtained using mature, highly reliable, very low cost technology. No separate insulating spacers are required to achieve isolation. A single piece, stamped, low cost metal leadframe may be used. Conventional wire-bonding, die bonding may be used, for example but not limited to, soldering, thermo-compression bonding, thermosonic bonding and the like. There is no change in the chemistry of the materials being employed to create new concerns about device stability. Conventional transfer or injection molding techniques and materials may be used. There is no increase in the number of piece parts that need be handled during assembly. The same leadframe materials, thicknesses and manufacturing methodologies can be used. Thus, reliability issues caused by the technology changes associated with prior art approaches are avoided and the cost of manufacture and qualification of such single package, multiple die, electrically isolated power devices is lower than with such prior art approaches.

While the present invention has been illustrated for the case of a single package, dual die, electrically isolated power device with a footprint compatible with that of an existing well known standard package configuration, those of skill in the art will appreciate based on the description herein that any number of die may be incorporated in a single package by providing additional spaced-apart die flags and related groups of leads having the desired periodic spacing, as a part of the leadframe, and forming a single encapsulation around the combination. Thus, dual, quad, hex, octal and other combinations of isolated, multi-die, single package devices may be obtained.

Based on the description herein, those of skill in the art will understand that the present invention provides improved means and method for single package, multiple die, electrically isolated devices, especially power semiconductor devices, and further does so using mature technology which is especially low in cost and high in reliability, and further provides single package, multiple die, electrically isolated power devices which are compatible with existing standard package configurations, for example, which have the same PC board footprint as existing standard packages.

While the present invention has been described for convenience of illustration by particular embodiments, those of skill in the art will understand that many variations thereon may be made without departing from the spirit of the present invention. Accordingly, it is intended to include the above-described variations, and such other variations as will occur to those of skill in the art based on the description herein, in the claims that follow.

We claim:

1. A semiconductor device comprising, multiple leads for external connection protruding from a first edge of the device and having longitudinal central axes and arranged in at least two like groups each having two or more leads, wherein a first of the groups is adjacent a first end of the device and a second of the groups is adjacent a second, opposite, end of the device and, wherein, within the first and second groups the leads have a first pre-determined axis-to-axis spacing and, wherein, between the first and second groups the facing leads of the first and second groups have a second axis-to-axis spacing which is an integral multiple equal or greater than twice the first axis-to-axis spacing, and wherein at least one lead of the first group comprises a first die flag for receiving a first semiconductor device and at least one lead or the second group comprises a second die flag for receiving a second semiconductor device, wherein the first and second die flags are separated by an insulating molded-in-place encapsulation material.

2. The device of claim 1 wherein the first and second die flags each have facing notches therein surrounded by the insulating encapsulation material and wherein a mounting opening extends through the insulating encapsulation material molded-in-place between the facing notches.

3. The device of claim 1 wherein the first and second die flags have non-die mounting surfaces that are are coplanar with surfaces of the leads facing in the same direction as the non-die mounting surfaces.

* * * * *